United States Patent [19]

Kang

[11] Patent Number: 5,179,332
[45] Date of Patent: Jan. 12, 1993

[54] NMR RADIO FREQUENCY COIL WITH DISABLE CIRCUIT

[75] Inventor: Yoon-Won Kang, Naperville, Ill.

[73] Assignee: General Electric Company, Milwaukee, Wis.

[21] Appl. No.: 745,816

[22] Filed: Aug. 16, 1991

[51] Int. Cl.[5] ............................................. G01R 33/20
[52] U.S. Cl. ..................................... 324/313; 324/307
[58] Field of Search ............... 324/300, 307, 309, 310, 324/311, 312, 313, 314, 318, 322; 128/653.2, 653.5; 335/299; 333/219; 330/130

[56] References Cited

U.S. PATENT DOCUMENTS

| 4,471,305 | 9/1984 | Crooks et al. | 324/309 |
|---|---|---|---|
| 4,680,548 | 7/1987 | Edelstein et al. | 324/318 |
| 4,692,705 | 9/1987 | Hayes | 324/318 |
| 4,694,254 | 9/1987 | Vatis et al. | 324/309 |
| 4,694,255 | 9/1987 | Hayes | 324/318 |
| 4,799,016 | 7/1989 | Rezvani | 324/318 |
| 4,820,985 | 4/1989 | Eash | 324/318 |
| 4,833,409 | 5/1989 | Eash | 324/318 |
| 4,924,191 | 5/1990 | Erb et al. | 330/130 |
| 5,136,243 | 8/1992 | Starewicz et al. | 324/318 |

Primary Examiner—Michael J. Tokar
Attorney, Agent, or Firm—Quarles & Brady

[57] ABSTRACT

A radio frequency coil for use in MR imaging applications includes a series of conducting segments aligned with the longitudinal, static magnetic field of the MR magnet. A hybrid power splitter/combiner feeds to and receives from each axial segment a phased signal to generate or receive a transverse circularly polarized magnetic field. The power splitter combiner isolates the axial segments to reduce magnetic field distortions produced by capacitive coupling between the imaged object and the radio frequency coil. Each segment may be disabled by an associated solid state switch so as to isolate the radio frequency coil from other radio frequency coils that may be used in conjunction with it either for specialized transmitting or receiving functions.

12 Claims, 6 Drawing Sheets

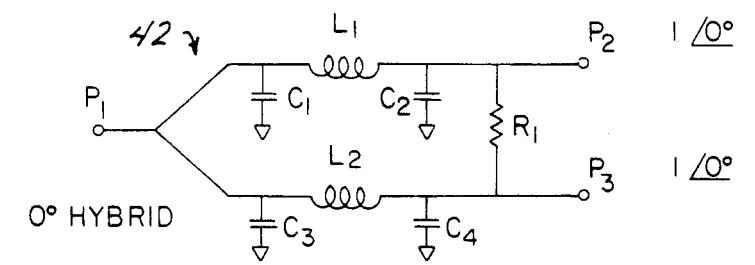
FIG. 6a
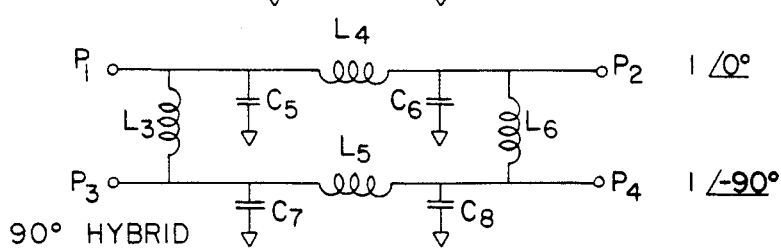
FIG. 6b
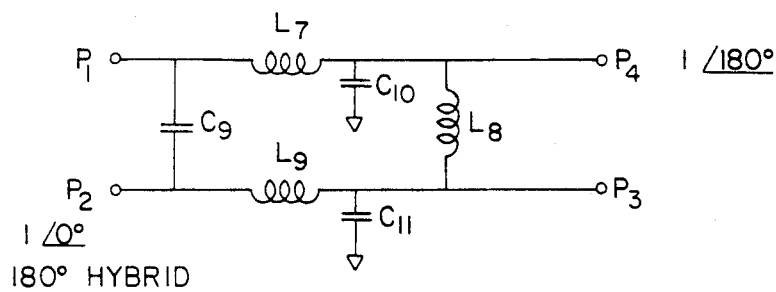
FIG. 6c
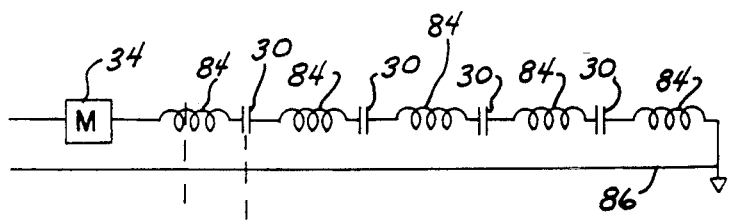
FIG. 7a
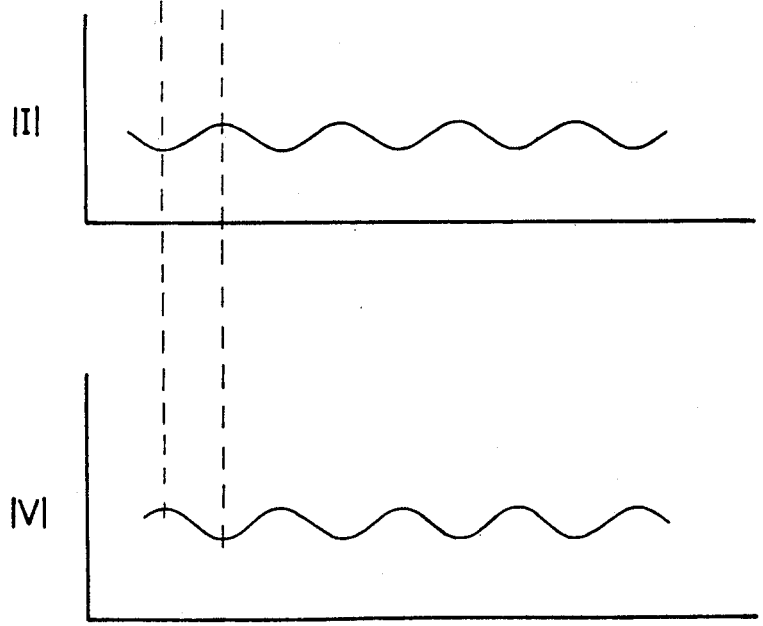
FIG. 7b
FIG. 7c

NMR RADIO FREQUENCY COIL WITH DISABLE CIRCUIT

BACKGROUND OF THE INVENTION

This invention relates to nuclear magnetic resonance (NMR) imaging methods and systems. More specifically, this invention relates to radio frequency (RF) coils used with such apparatus for transmitting and receiving RF signals

NMR Imaging

In NMR imaging, a uniform magnetic field $B_0$ is applied to the imaged object along the z axis of a Cartesian coordinate system, the origin of which is centered within the imaged object. The effect of the magnetic field $B_0$ is to align the object's nuclear spins along the z axis. In response to an RF magnetic signal of the proper frequency, oriented within the x-y plane, the nuclei precess about the z-axis at their Larmor frequencies according to the following equation:

$$\omega = \gamma B_0$$

where $\omega$ is the Larmor frequency, and $\gamma$ is the gyromagnetic ratio which is constant and a property of the particular nuclei. Water, because of its relative abundance in biological tissue and the properties of its nuclei, is of principle concern in such imaging. The value of the gyromagnetic ratio $\gamma$ for water is 4.26 khz/gauss and therefore in a 1.5 Tesla polarizing magnetic field $B_0$ the resonant or Larmor frequency of water is approximately 63.9 Mhz.

In a typical imaging sequence, the RF signal centered at the Larmor frequency $\omega$, is applied to the imaged object by means of a radio frequency (RF) coil. A magnetic field gradient $G_z$ is applied at the time of this RF signal so that only the nuclei in a slice through the object along the x-y plane, which have a resonant frequency $\omega$, are excited into resonance.

After the excitation of the nuclei in this slice, magnetic field gradients are applied along the x and y axes. The gradient along the x axis, $G_x$, causes the nuclei to precess at different resonant frequencies depending on their position along the x axis, that is, $G_x$ spatially encodes the precessing nuclei by frequency. Similarly, the y axis gradient, $G_y$, is incremented through a series of values and encodes y position into the rate of change of phase as a function of gradient amplitude, a process typically referred to as phase encoding.

A weak RF signal generated by the precessing nuclei may be sensed by the RF coil and recorded as an NMR signal. From this NMR signal, a slice image may be derived according to well known reconstruction techniques. An overview NMR image reconstruction is contained in the book "Magnetic Resonance Imaging, Principles and Applications" by D. N. Kean and M. A. Smith.

NMR RF Coil Design

The quality of the image produced by NMR imaging techniques is dependent, in part, on the strength and uniformity of the RF signal used to excite the nuclei. The strength of the RF magnetic signal directly affects the signal-to-noise ratio of the resultant image. The strength of the RF signal is limited, in practice, by the efficiency of power transfer from the RF generator to the RF coil, the optimum level of NMR excitation, and by the tolerance of the patient to RF power deposition. The uniformity of the magnetic field affects both the slice selectivity of the $G_x$ gradient and the severity of image artifacts that may be produced from phase differences in the excited nuclei introduced by variations in the RF signal.

Referring to FIG. 1, a nucleus 10 has a magnetic moment 12 which may be excited into precession 18 about a static magnetic field $B_0$ by an RF magnetic signal producing magnetic vector 14 along a plane perpendicular to the static magnetic field $B_0$.

The excitating RF magnetic field 14 may oscillate along a single axis within the x-y plane. Such an oscillating field may be generated by a "saddle" coil (not shown) comprised of two conductive loops disposed along the axis of oscillation and perpendicular to the static magnetic field $B_0$ as is known in the art.

A more effective excitation of the nuclear moments 12 may be achieved with a circularly polarized RF magnetic field, i.e. one that produces a rotating magnetic vector 14. Preferably, the magnetic vector 14 rotates within the x-y plane at an angular velocity equal to the Larmor frequency $\omega$ as shown by arrow 20 in FIG. 1.

It is known that a rotating RF magnetic vector may be generated with certain RF coil structures when the coil structure is excited at its "resonant" frequency. Referring to FIG. 2, one such coil structure 28 for creating a rotating magnetic field is comprised of a pair of conductive hoops 22 spaced along the axis of the static magnetic field $B_0$. The hoops 22 are joined with a series of conductive segments 24 parallel to axis of the static magnetic field $B_0$. The hoops 22 and conductive segments 24 have an intrinsic inductance and may be broken along their length with capacitive elements 30 to promote the desired pattern of current flow through the conductive segments 24 when the coil is driven by an external RF generator 26.

When the coil structure 28 is driven at a particular frequency, the phase of the current distribution in each axial segment 24 will equal the transverse angle $\theta$ of the segment 24 measured around the axis of the static magnetic field $B_0$. This phase distribution is the result of a "delay line" effect of the intrinsic inductance of the hoop elements 22 and the capacitance of the axial segments 24. At the driving frequency the delay line produces a full 360° of phase shift, in the current flowing though the conductive segments 24, for 360° of angular displacement $\theta$ of the conductive segments 24. As is understood in the art, this current distribution circularly polarizes the RF magnetic field 14 as described above.

Detailed descriptions of several RF coil structures which use the phase shifting properties of various coil geometries at a given frequency, are given in the following U.S. patents assigned to the assignee of the present application and hereby incorporated by reference: U.S. Pat. No. 4,680,548, entitled: "Radio Frequency Field Coil for NMR" and issued Jul. 14, 1987; U.S. Pat. No. 4,692,705, entitled: "Radio Frequency Field Coil for NMR" and issued Sep. 8, 1987; and, U.S. Pat. No. 4,694,255, entitled: "Radio Frequency Field Coil for NMR" and issued Sep. 15, 1987. These designs will be referred to collectively as "resonant RF coils".

Referring still to FIG. 2, the coil structure 28 may be driven by a RF generator directly connected across one of the capacitive elements 30 in a conductive segment 24. Alternatively, U.S. Pat. No. 4,638,253, entitled:

"Mutual Inductance NMR RF Coil Matching Device, issued Jan. 20, 1987, teaches a method of inductively coupling an RF source 26 to the coil structure 28. This patent is also assigned to the assignee of the present application and hereby incorporated by reference.

It will be apparent, by application of the law of superposition, that in the resonant coil design, considerable current will flow circumferentially through the conductive hoops 22 which connect the conductive segments 24. This current is the sum of currents flowing through each conductive segment 24 on opposite sides of the coil 28. The circumferential currents produce longitudinal magnetic field components along the $B_0$ axis (not shown) in distinction from the desired transverse rotating magnetic field 14. These longitudinal field component may adversely affect the axial homogeneity of the generated transverse magnetic field 14.

During an MR imaging sequence, the object to be imaged (also not shown) is placed within the coil volume as defined by the hoops 22 and conductive segments 24. The proximity of the imaged object to the coil structure results in capacitive coupling between the coil 28 and the imaged object and therefore an increased loss of RF power within the imaged object from dielectric heating.

To the extent that the imaged object is not uniform in cross section or is unevenly centered within the RF coil 28, the capacitive coupling to the imaged object will vary among different coil elements as will the dielectric losses coupled to these different coil structures. The effect of this uneven loading on the RF coil 28 will be to "detune" the coil structure upsetting the delay line of the coil structure and hence distorting the phase distribution of the currents in the conductive segments 24. A change in the phase distribution of the axial currents may produce distortion in the reconstructed NMR image and reduce the RF power coupled from the RF generator 26.

Disabling the RF coil

It is known to disable a resonant RF coil to prevent distortion of the RF field when the resonant RF coil is used in conjunction with other coils. For example, the resonant RF coil may be used only to transmit an RF signal and a local coil may be used to receive the NMR signal from the patient. During the reception period, the resonant RF coil must be disabled so as not to consume the RF energy of the NMR signal, thus weakening the NMR signal, and so as not to distort the uniformity of the RF signal as it is received by the local coil. Likewise, if the resonant coil is used for reception, it must be decoupled from the transmitted RF signal so as not to distort that signal. One method of disabling a resonant RF coil is taught in U.S. Pat. No. 4,833,409 to Eash entitled:"Apparatus for Dynamically Disabling an NMR Field Coil", assigned to the same assignee as the present invention and hereby incorporated by reference.

SUMMARY OF THE INVENTION

The present invention provides a method of disabling the non-resonant RF coil design described in co-pending parent application Ser. No. 07/513,921 entitled: RADIO FREQUENCY FIELD COIL AND POWER SPLITTER FOR NMR of which this is a continuation-in-part. This RF coil will be termed a "phased array" coil to distinguish it from the prior art "resonant RF coils" described above.

Specifically, in the invention an NMR RF coil for transmitting or receiving a rotating transverse magnetic field includes a plurality of conductive segments parallel to a longitudinal axis and spaced around the longitudinal axis at angles $\theta$. A power splitter combiner feeds each of the conductive axial segments with a separate RF signal to induce currents $i(t) = \sin(\omega t + \theta)$ in the axial segments, where $\theta$ is the transverse angle $\theta$ of the axial segment in which it flows. Each segment is connected to a switch for detuning the segment in response to a disable signal.

It is thus one object of the invention to provide a means for disabling or isolating a phased array coil from other RF coils. The disabling of a resonant RF coil is well understood; the high quality factor ("Q") design of a resonant RF coil allows it to be effectively disabled simply by tuning its resonant frequency away from the NMR frequency. This detuning may be accomplished, for example, by closing a few conductive shunts to ground placed at current nodes around the Resonant RF coil.

The phased array coil of the present invention, however, cannot be disabled by a conductive shunts because the coil does not resonate as a whole but rather each conductive segment is a separate resonant structure isolated from the other segments by the splitter combiner. The switches of the present invention, associated with each conductive segment, allow each segment to be separately detuned and thus the entire coil to be disabled.

The detuning switches, in one embodiment, are positioned to completely disconnect one end of each conductive segment from any current carrying path.

It is thus another object of the invention to provide a more complete decoupling of the phased array coil than may be obtained simply by detuning each segment. The segments have relatively low "Q" and hence simply detuning them may have limited effect. Using the switches to break any current path from the conductive segment improves the isolation at the phased array coil beyond that obtained simply by detuning.

The foregoing and other objects and advantages of the invention will appear from the following description. In the description, reference is made to the accompanying drawings which form a part hereof and in which there is shown by way of illustration, a preferred embodiment of the invention. Such embodiment does not necessarily represent the full scope of the invention, however, and reference must be made therefore to the claims herein for interpreting the scope of the invention.

BRIEF DESCRIPTION OF THE DRAWINGS

FIG. 6(a) is a schematic representation of a lumped element implementation of a 0° hybrid network used in the splitter/combiners of FIGS. 4 and 5;

FIG. 6(b) is a schematic representation of a lumped element implementation of a 90° hybrid network used in the splitter/combiners of FIGS. 4 and 5;

FIG. 6(c) is a schematic representation of a lumped element implementation of a 180° hybrid network used in the splitter/combiners of FIGS. 4 and 5;

FIG. 7(a) is a lumped element representation of a single conductive segment of the RF coil of FIG. 3 showing the return current path through the shield;

FIG. 7(b) is a chart showing the magnitude of the current in the conductive segment of FIG. 7(a) as a function of distance along the conductive segment;

FIG. 7(c) is a chart showing the magnitude of the voltage on the conductive segment of FIG. 7(a) as a function of distance along the conductive segment;

DETAILED DESCRIPTION OF THE PREFERRED EMBODIMENT

Figure 1:
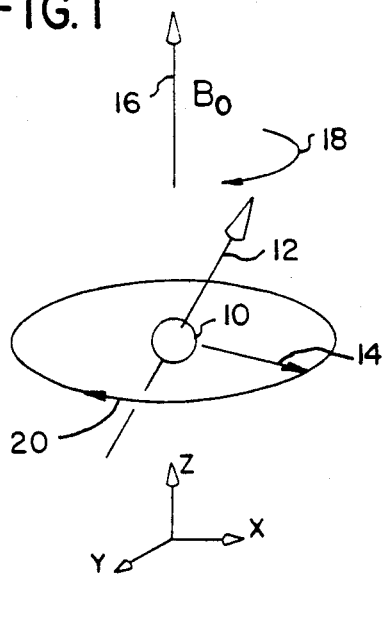
FIG. 1 is a representation of a precessing nuclear spin excited by an RF magnetic signal showing the orientation of the static magnetic field $B_0$ and the RF magnetic vector.
Figure 2:
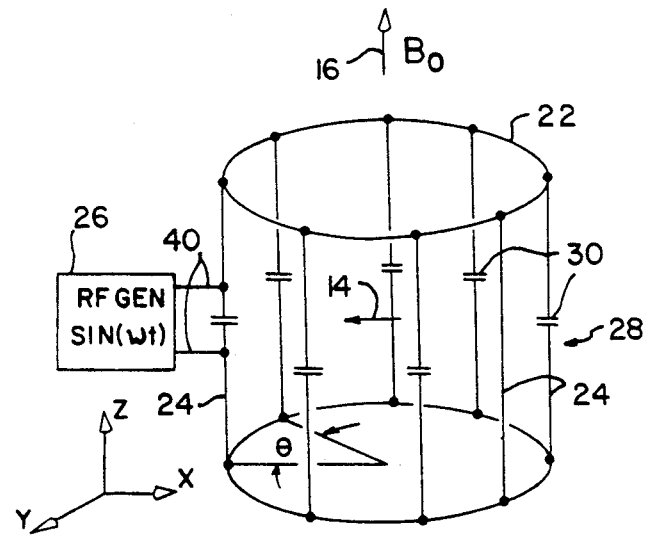
FIG. 2 is a schematic representation of a resonant RF coil employing opposing conductive hoops, as discussed in the Background of the Invention.
Figure 3:
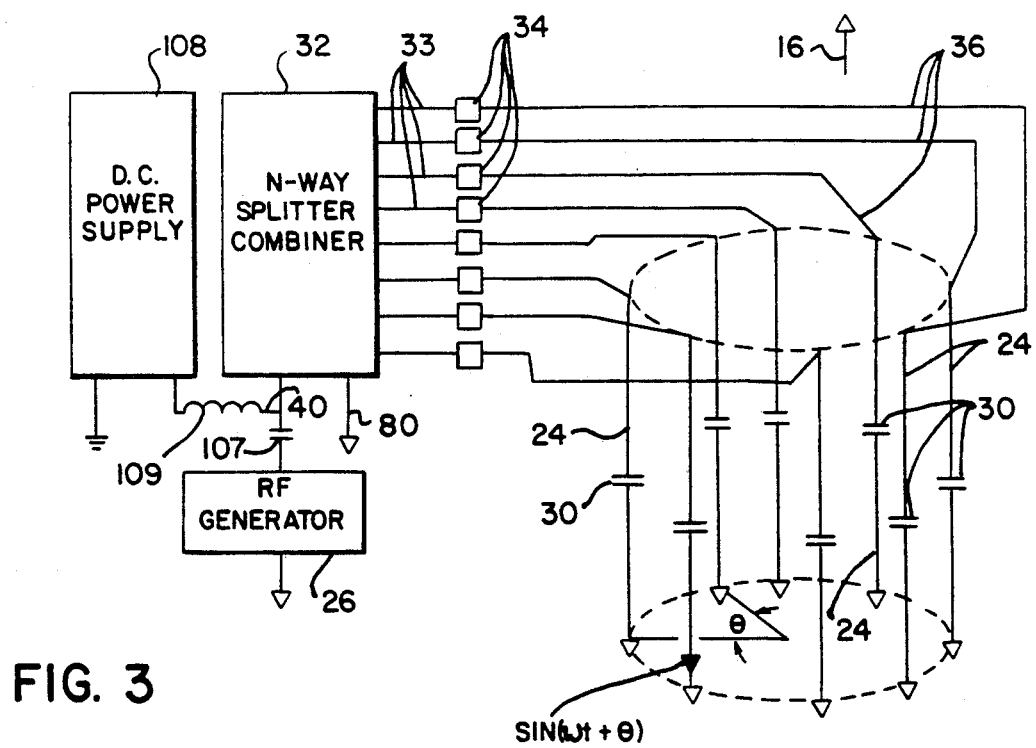
FIG. 3 is a schematic representation of the RF coil of the present invention, showing the connection of the N-way power splitter/combiner and placement of the matching network/disable switches.

Referring to FIG. 3, an RF coil according to the present invention is comprised of five parts. The first part is an N-way power splitter/combiner 32 having N ports 33 for producing a set of phased signals from a single RF source 26. The RF generator 26 is connected to an input port 40 of the N-way power splitter combiner 32 via a DC blocking capacitor 107 to prevent interference with a DC power supply 108 to be described below.

The second part is a set of N matching networks/disable switches 34 with inputs connected to the ports 33.

The third part is a series of N conductive segments 24 (where N is the number of segments) connected to the outputs 36 of the matching networks/disable switches 34.

Figure 8:
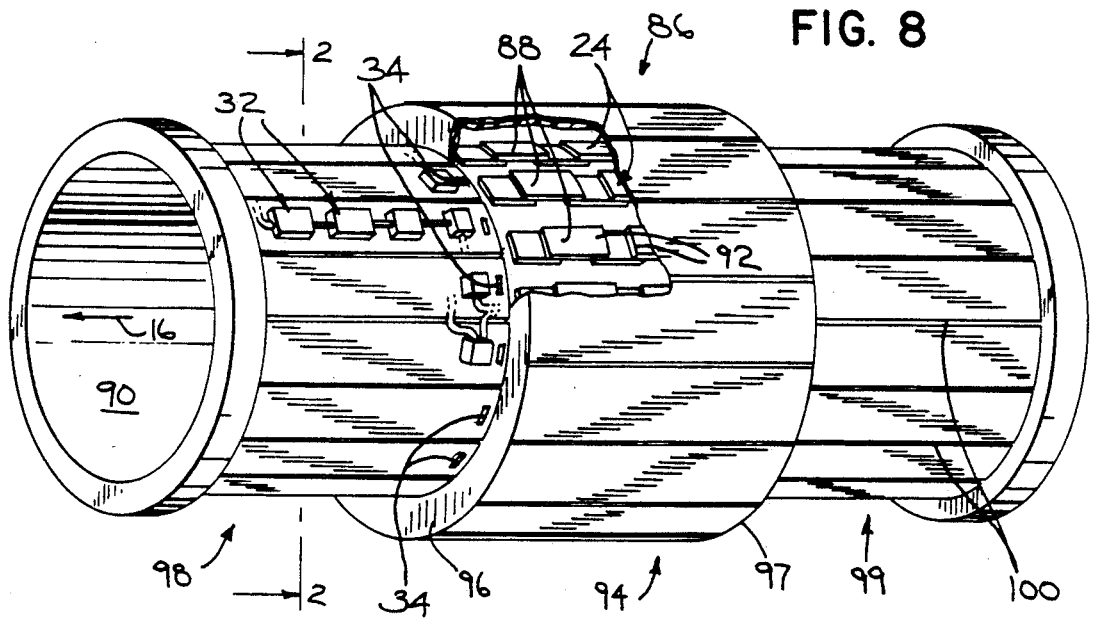
FIG. 8 is a perspective view of the RF coil of FIG. 3.

The fourth part is a conductive shield 86, as shown in FIG. 8, to form the ground or common potential of the coil for returning the RF signal conducted through the conductive segments 24 to the RF generator 26.

The fifth part is a DC power supply for providing a current used to activate the disable switches of the matching networks/disable switches 34. The DC power supply is connected to the input port 40 of the N-way power splitter combiner 32 through through an RF choke 109, to prevent interference between the DC power supply 108 and any RF signal.

In the description of the invention that follows the static magnetic field $B_0$ 16 is assumed to be aligned with the Z-axis in a standard right handed coordinate system.

The N-way Power Splitter/Combiner

General Description

Referring still to FIG. 3, the N-way power splitter/combiner 32 serves as either a splitter or a combiner, depending on the direction of signal flow. As a splitter, it is used to divide a single input signal from RF generator 26 into N separate output signals at ports 33. Each of the N output signals is of equal amplitude and separated by $2\pi/N$ radians of phase. The N-way power splitter/combiner 32 also provides electrical isolation between the N ports 33, so that reflected energy resulting from an impedance mismatch between one port 33 and its associated conductive segment 24 will not affect the signals present on any of the other ports 33.

These N equal magnitude and equally phase spaced signals will be applied to the N matching networks/disable switches 34, which in turn will apply them to the N conductive segments 24. Since the phase of each signal corresponds to the angular position of the conductive segment 24 to which it is applied, the currents flowing in the conductive segments 24 will be phased according to their angular position. This will produce the transverse circularly polarized RF magnetic field vector which excites the nuclear spins, as is understood in the art.

In the reverse direction of signal flow, the N ports 33 function as input ports, and the N-way splitter/combiner 32 functions as a combiner and is used to combine N separate input signals into a single output signal at output port 80. When the signals on the N input ports are separated by $2\pi/N$ radians of phase, their combined power will be directed to the output port 80, while no power will flow from the isolated port 40. The precessing nuclear spins will induce a signal in each of the conductive segments 24. The phase of these induced signals will be equal to the angular position of the conductive strips. In this way, the induced signal will be combined and be directed to the output port 80 of the N-way power splitter/combiner 32.

Implementation

Figure 4:
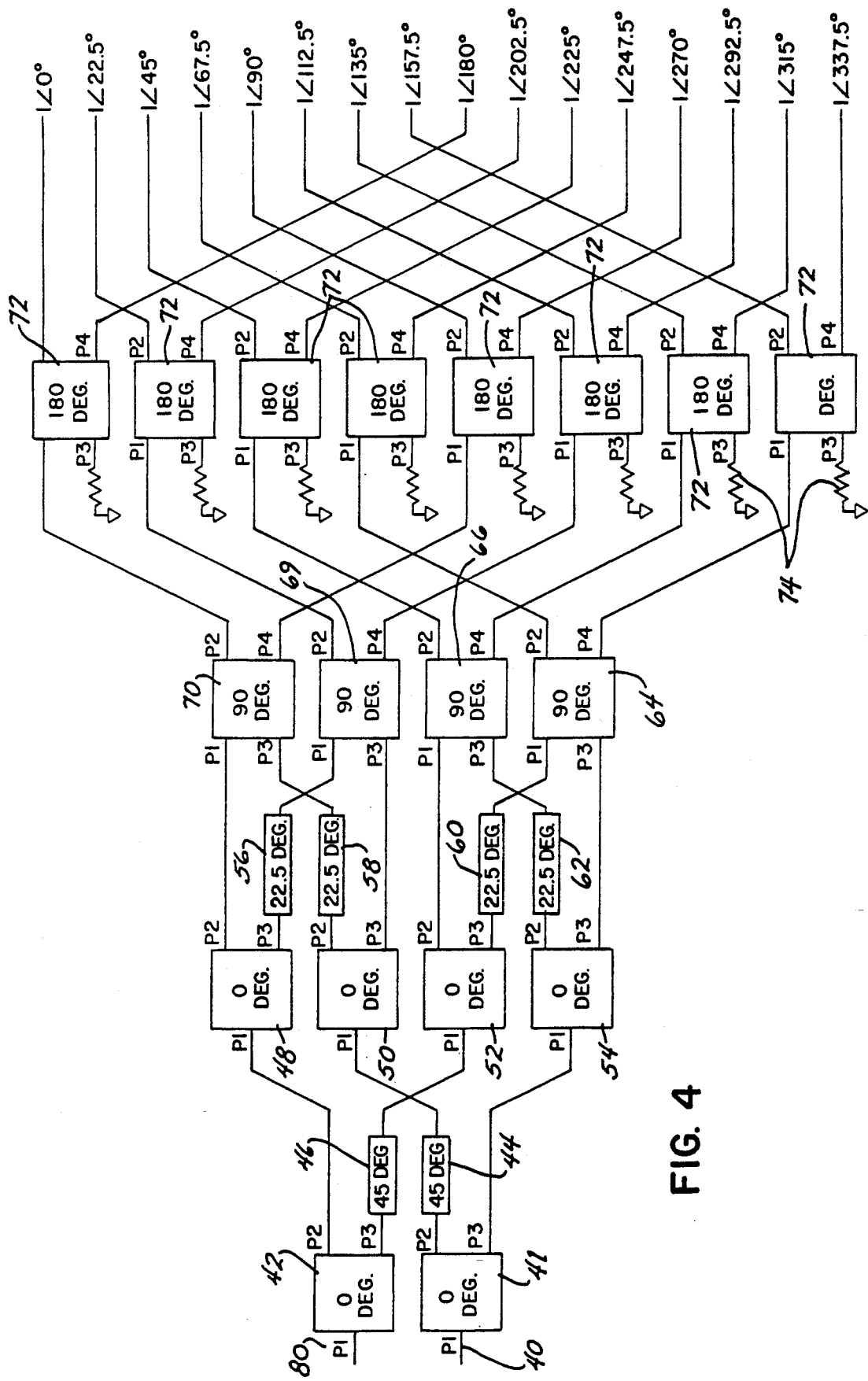
FIG. 4 is a schematic representation of a sixteen-way splitter/combiner of FIG. 3 showing the interconnection of the hybrid networks.

Referring to FIG. 4, in a first embodiment, a sixteen-way power splitter/combiner 32 for driving sixteen conductive segments 24, generates sixteen equal amplitude and frequency RF signals separated by 22.5° of phase difference. The RF signal from the RF generator 26 is input into input port 40 and is split first into two equal amplitude and phase signals by 0° hybrid network 41. One of these signals is phase shifted by a two-port 45° phase lag network 44 and then both signals are split into equal parts by 0° hybrid networks 50 and 54. Two of the thus produced four signals are then phase shifted in a pair of two-port 22.5° phase lag networks 58 and 62 respectively. All four signals are then each split into equal amplitude signals with 90° hybrid networks 64–70. The resulting eight signals are split into 180° opposed signals by 180° hybrids 72. The third uncommitted port on 180° hybrid networks 72 is terminated by means of a resistance 74 to ground. Resistance 74 is equal to the characteristic impedance of the system (50 ohms). The resistance 74 serves to absorb reflected energy returning to the hybrid network output ports resulting from mismatch between the impedance of the 180° hybrid network 72 and the matching networks/disable switches 34 or the 180° hybrid network 72 and the conductive segments 24, thus providing isolation between the signals connected to the conductive segments 24.

As will be discussed further below, each of the sixteen signals is attached to a conductive segment 24 through an impedance matching network/disable switch 34.

When the RF driving signal 40 ceases, the RF field produced by the precessing nuclear spins 12 may be received by the conductive segments 24 and conducted back through the matching networks/disable switches 34 to the N-way power splitter/combiner 32. Referring still to FIG. 4, the 180° hybrid networks 72 receive and combine those signals which are separated in phase by 180°. The phase separation of these received signals is a function of the transverse angular displacement of the receiving axial segments.

The combined signals from the 180° hybrid are again combined by the 90° hybrid networks 64–70, the combined signal being taken out of the previously uncommitted port of the 90° hybrid networks. Two of the resulting four signals are fed to two, two-port 22.5° phase lag networks 60 and 56 and the four signals are combined pair-wise by 0° hybrid network 52 and 48. One of the resulting signals is phase shifted by two-port phase lag network 46 and combined with the remaining in-phase signal in 0° hybrid network 42 to produce an NMR signal. Therefore, an RF isolation is achieved between the input and output of the splitter/combiner network 32.

Figure 5:
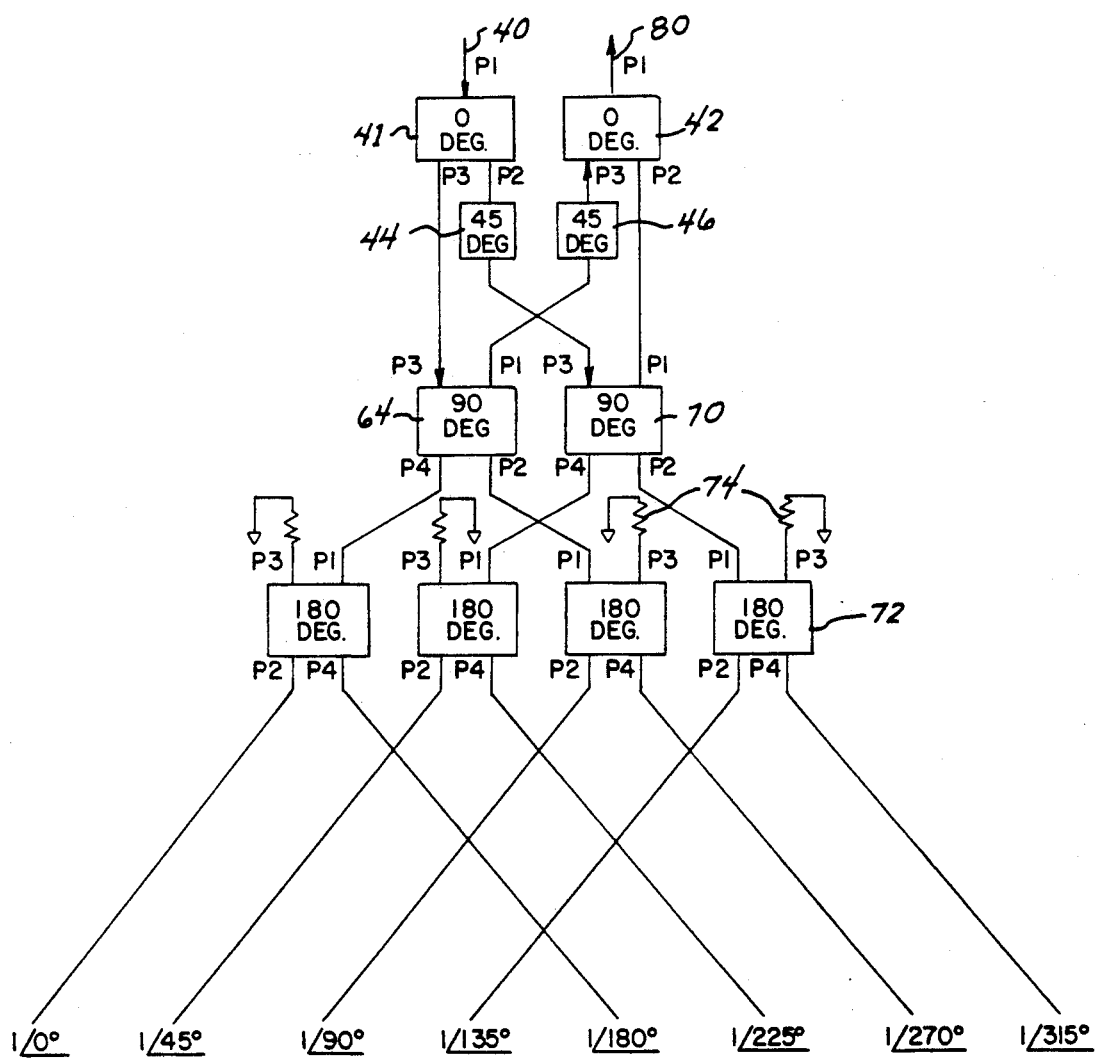
FIG. 5 is a schematic representation of an eight-way power splitter/combiner showing the interconnection of the hybrid networks.

Referring to FIG. 5, in a second embodiment, an eight-way power splitter/combiner for driving eight conductive segments 24, generates eight equal amplitude and frequency RF signals separated by 45° of phase difference. In a manner similar to the above described sixteen-way power splitter/combiner, the RF signal 40 from the RF generator 26 is split first into two equal amplitude and phase signals by 0° hybrid network 41. One of these signals is phase shifted by a two-port 45° phase lag network 44 and then both signals are split into equal parts by 90° hybrid networks 64 and 70. Each of the thus produced four signals is split and phase shifted by four 180° hybrid networks 72. Again, the third uncommitted port on 180° hybrid networks 72 is terminated by means of a resistance 74 to absorb reflected energy returning to the hybrid network output ports resulting from impedance mismatch.

The RF field produced by the precessing nuclear spins 12 is received and combined by the 180° hybrid network, working in reverse. The combined signals from the 180° hybrid are next combined by the 90° hybrid networks 64 and 70, the combined signal being taken out of the previously uncommitted port of the 90° hybrid networks. One of the resulting two signals is fed to a two-port 45° phase lag networks 46 and the two signals are then combined by means of 0° hybrid network 42 to produce an NMR signal through the other port of the splitter/combiner network 32.

Referring to FIG. 6(a)–(c), the hybrid networks forming the N-way power splitter/combiner 32 described above are constructed of discrete reactive and resistive elements.

Hybrid networks are four-port networks having the property that when the four ports are properly terminated, energy input to one port will be split between two of the remaining three ports, the split signals which may be given a relative phase shift. Conversely, when energy is input into two of the ports with proper magnitudes and phases, the energy will be combined out of one of the remaining two ports.

A further property of hybrid networks is that the reflected energy resulting from an impedance mismatch on one output port, e.g., from improper termination of the port or from a change in the impedance of the attached device, is partially directed to the third uncommitted port. This results in a degree of electrical isolation between the split signals.

As used herein, the phase angle associated with a hybrid will refer to the relative phase of the two signals produced when one signal is split or the phase angle required between two signals to be combined into a single signal of zero degrees shift relative to one of the two signals.

The use of hybrid networks to split and combine RF signals, and to impose a phase shift on the split signals, is known in the art. Such devices may be made from wave guides, as in the case with microwave equipment, or for lower frequencies, as with the present invention, from a combination of discrete inductive, capacitive and resistive elements arranged in a network. Examples of the design of such networks may be found in the reference: Jerome L. Altman, *Microwave Circuits*, Van Nostrand, 1964.

Referring now to FIG. 6(a), a 0° hybrid network 42 has a port P1 connected to one side of capacitor C1 and C3 and inductors L1 and L2. The remaining side of C1 and C3 is connected to a ground. The remaining side of inductor L1 is connected to port P2, one side of capacitor C2 and one side of resistor R1. The remaining side of inductor L2 is connected to port P3, one side of capacitor C4 and the remaining side of resistor R1. The remaining side of C2 and C4 is connected to ground. The value of each of the capacitors is matched to the characteristic impedance $z_o$ of the transmission line from the RF generator 26 and to the matching networks/disable, switches 34 (approximately 50 ohms) or $+jz_o$, where $j=\sqrt{-1}$. The value of each of the inductors is $-jz_o$ and the value of the resistor R1 is $2z_o$.

Referring now to FIG. 6(b), a 90° hybrid network 64 has a port P1 connected to one side of inductor L3 and L4 and capacitor C5. The remaining side of L4 is connected to one side of capacitor C6 and inductor L6 and port P2. Port P3 is connected to the remaining side of inductor L3 and to one side of inductor L5 and capacitor C7. The remaining side of L5 is connected to one side of capacitor C8 and to the remaining side of L8 and port P4. The remaining sides of capacitors C5, C6, C7, and C8 are connected to ground. The value of each of the capacitors is $$\frac{-jz_o}{1+\sqrt{2}}.$$

The value of the inductors L4 and L5 is $$\frac{jz_o}{\sqrt{2}},$$

and the value of the inductors L3 and L6 is $jz_o$.

Referring now to FIG. 6(c), a 180° hybrid network 72 has a port P1 connected to one side of inductor L7 and capacitor C9. The remaining side of L7 is connected to one side of capacitor C10 and inductor L8 and port P4. Port P2 is connected to the remaining side of capacitor C9 and to one side of inductor L9. The remaining side of L9 is connected to one side of capacitor C11 and to the remaining side of L8 and port P3. The remaining sides of capacitors C10, and C11 are connected to ground. The value of capacitor C9 is $-jz_o\sqrt{2}$ and the value of capacitors C10 and C11 is $$\frac{-jz_0}{\sqrt{2}}.$$

The value of each of the inductors is $jz_0\sqrt{2}$.

The two port phase lag networks such as 44, described above, are constructed of lengths of transmission line sized to provide the proper phase lag at the Larmor frequency. Other methods of constructing such phase lag networks will be apparent to one skilled in the art.

The Matching Networks/Disable Switches

Referring again to FIG. 3, the N matching networks/disable switches 34 attach the N ports 33 of the N-way power splitter/combiner 32 to the N conductive segments 24 and detune the conductive segments 24 and hence the coil.

The matching network part of the matching networks/disable switches 34 serves to match the output impedance of the N-way power splitter/combiner 32 (50 ohms) to input impedance of the conductive segments 24 at the frequency of the RF signal from the RF generator 26. It should be noted that the input impedance of the conductive segments 24 will vary somewhat as a function of the coupling between the conductive segments 24 and the imaged object (not shown). Accordingly, the matching networks 24 are adjusted to match the conductive segment 24 input impedance for an average imaging situation, as determined by measurement. The construction of such impedance matching network is well understood in the art.

The disable switch part of the matching networks/disable switches 34 serves to detune the conductive segments 24, either by shunting one end of each conductive segment 24 to ground, or by disconnecting one end of each conductive segment 24 from the N-way splitter/combiner 32 and hence from the other conductive segments 24.

Figure 10:
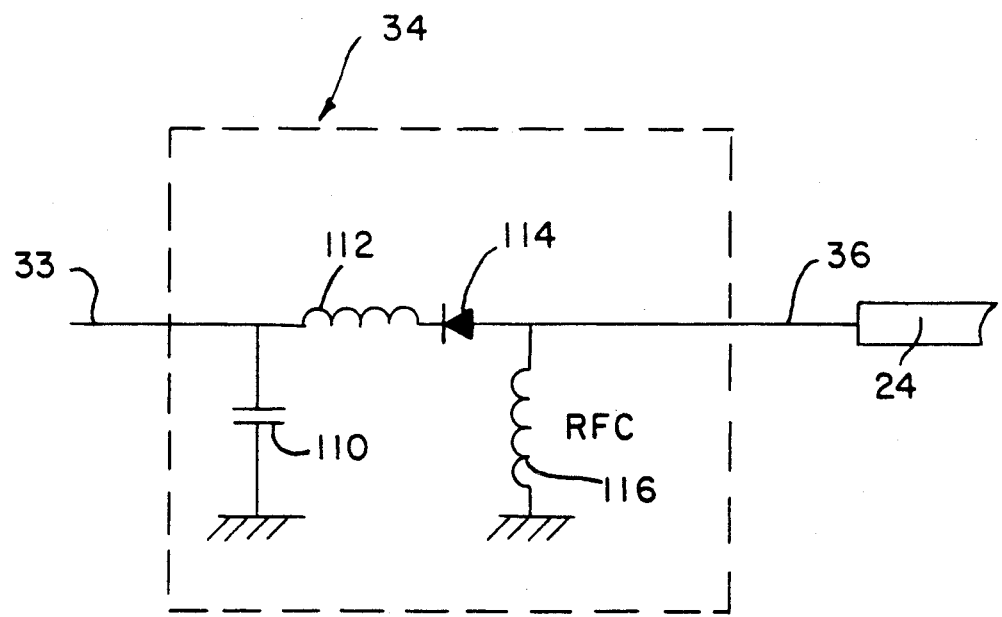
FIG. 10 is a detailed schematic of a matching network/disable switch of FIG. 3 for detuning the RF coil and disconnecting each segment.

Referring to FIG. 10, in a first embodiment, each matching network/disable switch 34 receives an input from port 33 of the N-way power splitter/combiner 32. This input 33 is connected to one terminal of both capacitor 110 and inductor 112. The remaining terminal of the capacitor 110 connects to ground and the remaining terminal of the inductor 112 connects to the cathode of PIN diode 114 whose anode connects to the conductive segment 24 via output 36. The capacitor 110 and the inductor 112 together provide the impedance matching as described above, and their values are selected based on the output impedance of the N-way power splitter combiner 32 and the input impedance of the conductive segment 24. A radio frequency choke 116 connects from the anode of the PIN diode 114 to ground, to provide a DC current path for a biasing signal as will be described.

During periods when the RF coil is not disabled, the DC power supply 108 (shown in FIG. 3) is activated to provide a negative biasing voltage to the cathode of the PIN diode 114, causing the PIN diode to conduct and thus to connect the matching network of capacitor 110 and inductor 112 to the conductive segment 24 for the purposes of a superimposed RF signal. The current from the DC power supply 108 passes through the N-way combiner/splitter 32 and returns to ground, after passing through PIN diode 114, through means of RF choke 116. During the disabling of the RF coil, the DC biaiing voltage from the DC power supply 108 is removed, causing PIN diode 114 to cease conducting and thus effectively disconnecting the conductive segment 24 from the matching network of capacitor 110 and 112 and from the N-way splitter/combiner 32. This disconnection detunes the strip 24 and also removes any current path from that end of strip 24. This direct cutting off of any current path by PIN diode 1 is preferred to detuning alone, as it provides an improved disabling of the RF coil given the low "Q" of the conductive segments 24.

Figure 11:
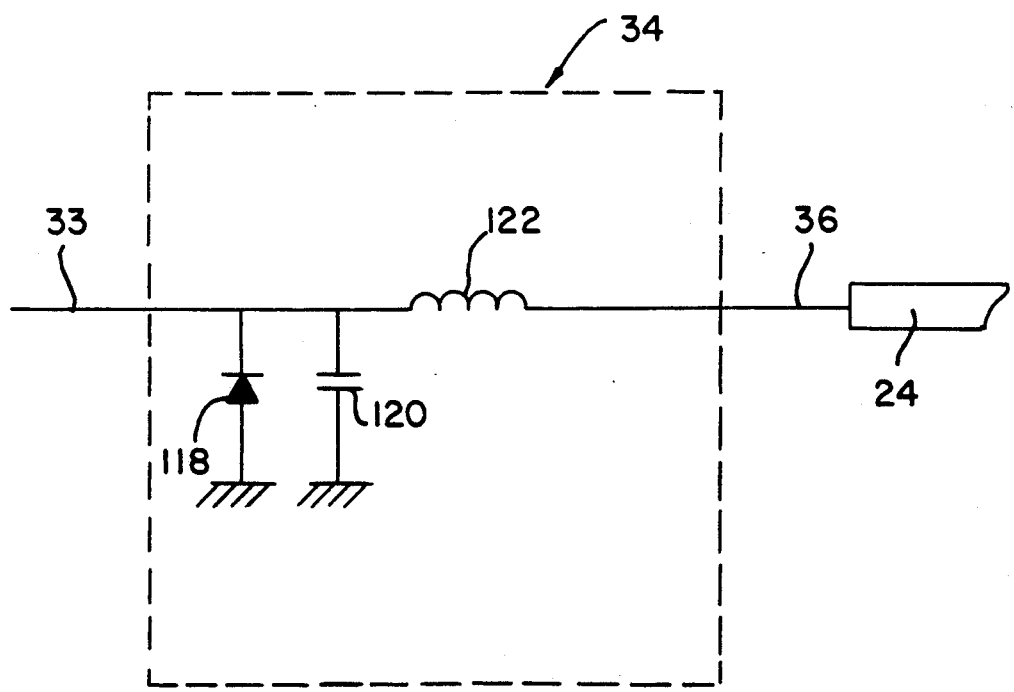
FIG. 11 is a detailed schematic of a second embodiment of a matching network/disable switch of FIG. 3 for detuning the RF coil.

Referring to FIG. 11, in a second embodiment, each matching network/disable switch 34 receives an input from a port 33 of the N-way power splitter/combiner 32 at the cathode of a PIN diode 118, the anode of which connects to ground. Shunting the PIN diode 118 is capacitor 120 forming part of the matching network portion of the matching network/disable switch 34. An inductor 122 connects, at one end, to the cathode of the PIN diode 118 and one terminal of the capacitor 120. The other end of the inductor 122 is connected, via output lead 36, to a conductive segment 24. The capacitor 120 and the inductor 122 together provide the impedance matching as described above, and their values are selected based on the output impedance of the N-way power splitter combiner 32 and the input impedance of the conductive segment 24.

In the reverse of the first embodiment, during periods when the RF coil is disabled, the DC power supply 108 (shown in FIG. 3) is activated to provide a negative biasing voltage to the cathode of the PIN diode 118, causing the PIN diode 118 to conduct and thus to short the conductive segment 24, through inductor 122, to ground. The RF is activiated when the DC biasing voltage from the DC power supply 108 is removed, causing PIN diode 118 to stop conducting and thus to no longer short the conductive segment 24 to ground. This second embodiment of the matching network/disable switch 34 detunes the strip 24 but does not eliminate current flow through the strip 24 in a circuit through the shield and thus is thought to be less effective in isolating the RF coil.

It will be understood from these two basic examples, that many modifications of these circuits will be suitable to practice this invention. For example, the polarity of the PIN diodes 114 and 118 and of the biasing voltage from the the DC power supply 108 may be changed and other networks may be used to accomplish either shunting of the conductive segment 24 or disconnecting of the conductive segment 24. Both the effect of detuning and of disconnecting the conductive strip will be henceforth referred to generally as detuning.

The Conductive Segments

Referring to FIG. 3, the conductive segments 24 are equally spaced around the circumference of a cylinder whose axis is parallel to the Z-axis. Each segment runs in the Z-direction. The angular position of the segments measured in the plane transverse to the Z-axis (the XY plane) will be termed $\theta$ and can be arbitrarily referenced to 0 along the X-axis. Each segment 24 has one end attached to an output of one of the matching network/disable switches 34, and the other end attached to ground through the coil's shield (not shown in FIG. 3), which provides a return current path to the RF generator 26. It should be noted that the hoop elements of prior art RF coil designs are not used in the present invention.

Referring to FIG. 7(a), the conductive segments 24 are broken along their length by capacitive elements 30. At the frequency of operation of the RF coil, the axial segments act like inductors 84. The capacitive elements are used to "tune out" the inductive effects of the conductive segments 24. This condition of series resonance minimizes the total impedance of the conductive segments 24. By minimizing the impedance of the conductive segments 24, the voltage across the conductive segments 24 is minimized and the current through the segments is maximized as shown in FIGS. 5(b) and 5(c). The increase in current in the segments 24 increases the magnitude of the RF magnetic field generated by the coil, making it more efficient at exciting the nuclear spins. The minimized voltage decreases the magnitude of the generated electric field, reducing the dielectric losses of RF energy in the imaged object, thus lowering the power absorbed by the imaged object.

An additional effect of the addition of the capacitive elements 30 is to reduce the ripple in the voltage and current distribution along the conductive segments 24 and hence to improve the uniformity of the magnetic field within the imaging volume.

It will be apparent to one skilled in the art that any number of conductive segments 24 may be used, with a lower limit imposed by the magnetic field uniformity and an upper limit imposed by practical splitter 32 implementations and the associated power losses. It is further desirable that the number of conductive segments 24 be a multiple of four for easier power splitter design. Many other modifications and variations of the preferred embodiment which will still be within spirit and scope of the invention will be apparent to those with ordinary skill in the art. For example, it will be apparent that the conductive segments 24 need not be evenly spaced from the bore axis or separated by equal angles; e.g. the conductive segments may be arranged around form of elliptical or other cross section. .In this case, the phase and amplitude of the N-way power splitter/combiner could be adjusted to provide the desired circularly polarized field.

Referring to FIG. 8, the conductive segments 24 are fabricated of conductive foil strips 88 glued to the outer surface of a non-conductive fiberglass bore tube 90 which provides the necessary dimensional rigidity. The foil strips are arranged axially and centered on the length of the fiberglass bore tube 90 which extends beyond them on either end. The capacitive elements 30 are produced by a series of lap joints 92 along the length of the conductive strips 88, the lap joints 92 separated by a nonconductive dielectric. As discussed, the total capacitance of the capacitive elements 30 is such as to match the inductance of the strips 88 at the operating frequency of the RF coil and to create a series resonance along the axial strip 24. The number of capacitive lap joints 92 used to create this total capacitance is preferably large enough so as to reduce the amplitude of the standing wave along the axial strip 88 as has been discussed, but in practice, the number of capacitive lap joints 92 is limited by the dielectric loss incurred in each capacitive lap joint 92. Too great of a total dielectric loss will reduce the quality factor, "Q", of the conductive segments 24 and degrade the efficiency of either the transmission or the reception of RF energy.

The Conductive Shield

Figure 9:
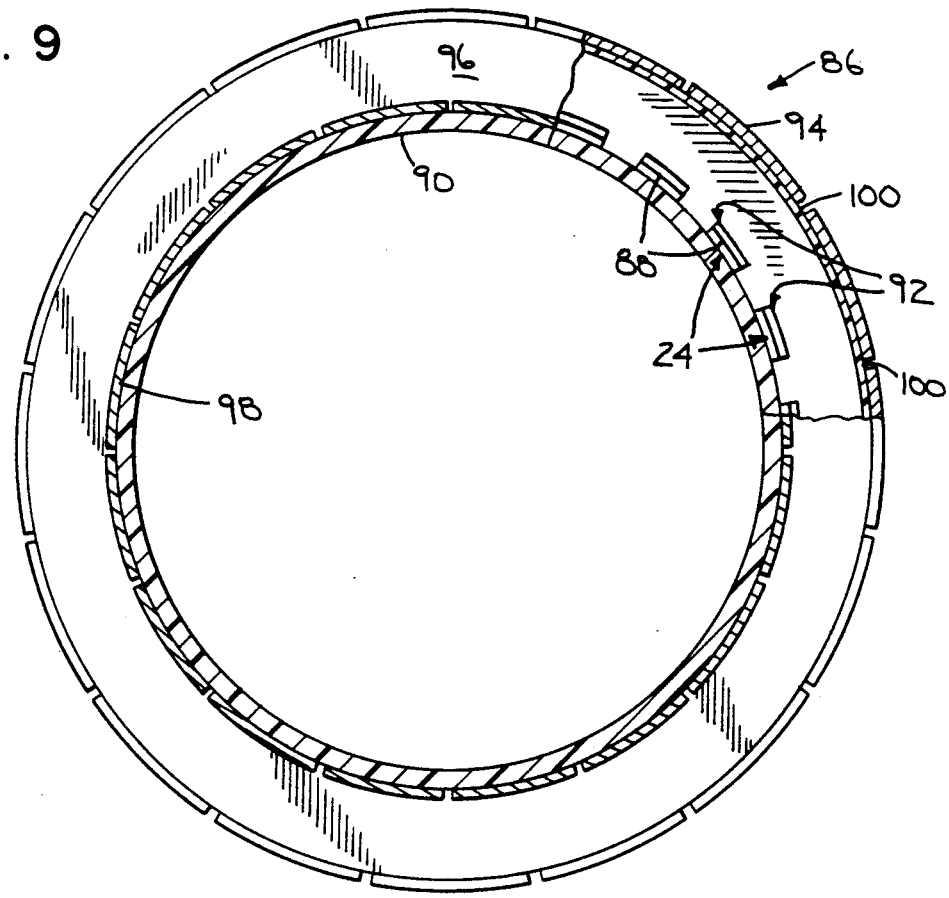
FIG. 9 is a cross sectional view along lines 7—7 of FIG. 8 showing the position of the axial segments with respect to the stepped shield.

Referring to FIGS. 8 and 9, the conductive shield 86 is generally a conductive tube which surrounds the foil strips 88 providing both a return path to ground for the ends of the foil strips 88 as described and a shield to contain generated RF energy during the transmission of an RF signal from the RF generator 26 and to limit received RF noise during the detection of RF energy from the imaged object. The shield 86 may be a straight tube or may have a stepped construction as described below.

The RF shield 86 of the preferred embodiment is formed of three conductive tubes 98, 94, and 99 connected together end-to-end along the common longitudinal bore axis 16. The outer conductive tubes 98 and 99 are of smaller diameter than the inner conductive tube 94 so as to create a shield with a reduced diameter outside of the area of the foil strips 88 which are centered within the ends of the inner conductive tube 94. This stepped design improves the shielding of the resulting structure and simplifies construction of the RF coil by permitting ready connection to the foil strips 88 as will be described.

The outer conductive tubes 98 and 99 are formed directly on either end of an insulating fiberglass tube 90 which supports the conductive segments 24 at its middle.

The inner conductive tube 94 is of larger diameter than the insulating fiberglass tube 90 and serves as a ground plane for the foil strips 88 which it surrounds. The inner conductive tube 94 is closed with a first and second endring 96 and 97 which electrically connect it to the smaller diametered outer tubes 98 and 99. The endrings 96 and 97 have a circular aperture cut in their centers of radius equal to the outside radius of the fiberglass tube 90 and thus equal to the approximate radius of the foil strips 88 as arranged on the surface of the fiberglass bore tube 90. The first endring 96 is connected to the first conductive tube 94 but is not connected to the foil strips 88. The second endring 97 is connected to the first conductive tube 94 and to the ends of the foil strips 88 and hence forms a return for current supplied to the other ends of the foils strips 88 by the matching networks/disable switches 34. This connection between the foil strips and the endring may be a direct "DC" electrical connection or through a capacitor.

The signals from the matching networks/disable switches 34 are fed through this endring 96, by means of direct connections through openings in the endring 96 to the conductive segments 24.

All three tubes 98, 94, and 99 are constructed of a good conductor such as copper or silver-plated copper.

As is understood in the art, the center conductive tube 94 and the end conductive tubes 98 and 99 are scored with longitudinal slots 100 to prevent the formation of surface eddy currents from gradient fields used in the NMR imaging sequence.

The above description has been that of a preferred embodiment of the present invention. It will occur to those who practice the art that many modifications may be made without departing from the spirit and scope of the invention. For example, it will be understood that the generation of the phased RF signals for driving the conductive segments 24 may be produced by means other than hybrid circuits, but rather may be produced by multiple amplifiers driven by digitally synthesized waveforms with the phasing described herein. In order to apprise the public of the various embodiments that may fall within the scope of the invention, the following claims are made.

I claim:

1. An NMR radio frequency coil for producing, during a transmit period, a rotating transverse magnetic field of frequency $\omega$ about a longitudinal axis, the coil comprising:
   an RF generator means for generating an RF signal $s(t)=\sin(\omega t)$ during the transmit period;
   a plurality of conductive segment means parallel to the longitudinal axis, and spaced around the longitudinal axis at transverse angles $\theta$ having a frequency of tuning;
   a power splitter means for receiving the RF signal and generating a plurality of phased signals, such signals connected to that conductive segment means with a corresponding transverse angle $\theta$ so as to induce currents $i(t)$ proportional to $\sin(\omega t+\theta)$ in those conductive segments means;
   a signal means responsive to the RF generator for producing a disable signal after the transmit period; and
   a plurality of switch means attached to each conductive segment means for receiving the disable signal and for detuning each conductive segment means away from the frequency $\omega$ in response to the disable signal.

2. The NMR radio frequency coil of claim 1 wherein the switch means are solid state diodes for shorting each conductive segment means to ground when in a conducting state and the disable signal is a DC voltage for biasing each solid state diode into the conducting state after the transmit period.

3. The NMR radio frequency coil of claim 1 wherein the switch means are solid state diodes for connecting each conductive segment means to the power splitter only when in a conducting state and the disable signal is a DC voltage for biasing each solid state diode into conductance during the transmit period.

4. The NMR radio frequency coil of claim 1 wherein the conductive segment means are equidistant from the longitudinal axis and the induced current equals $A\cdot\sin(\omega t+\theta)$ for some constant A.

5. The NMR radio frequency coil of claim 1 wherein the power splitter is constructed of series connected hybrid networks and the disable signal is a DC voltage received by the hybrid networks and communicated through the hybrid networks to the conducting segments.

6. The NMR radio frequency coil of claim 1 wherein the plurality of phased signals are connected to the plurality of conducting segments by impedance matching networks tuned to $\omega$.

7. An NMR radio frequency coil for receiving a transverse RF magnetic field from an imaged object, after excitation of the imaged object by an RF transmit pulse, during a transmit period the magnetic field being of frequency $\omega$ and rotating about a longitudinal axis, comprising:
   a plurality of conductive segment means substantially parallel to the longitudinal axis, and spaced around the longitudinal axis at transverse angles $\theta$ and tunable to a frequency $\omega$;
   a power combiner means connected to the conductive segment means for producing a signal $s(t)=\sin(\omega t)$ from a plurality of phased currents $i(t)$ proportional to $\sin(\omega t+\theta)$ received from the conductor segment means with corresponding transverse angle $\theta$;
   a signal means responsive to the occurrence of the RF transmit pulse for generating a disable signal during the RF transmit pulse; and
   a plurality of switch means attached to each conductive segment means for receiving the disable signal and for detuning each conductive segment means away from the frequency $\omega$ in response to the disable signal.

8. The NMR radio frequency coil of claim 7 wherein the switch means are solid state diodes for shorting each conductive segment means to ground when in a conducting state and the disable signal is a DC voltage for biasing each solid state diode into the conducting state during the transmit period.

9. The NMR radio frequency coil of claim 7 wherein the switch means are solid state diodes for connecting each conductive segment means to the power splitter only when in a conducting state and the disable signal is a DC voltage for biasing each solid state diode into conductance after the transmit period.

10. The NMR radio frequency coil of claim 7 wherein the conductive segment means are equidistant from the longitudinal axis and the induced current equals $A\cdot\sin(\omega t+\theta)$ for some constant A.

11. The NMR radio frequency coil of claim 7 wherein the power splitter is constructed of series connected hybrid networks and the disable signal is a DC voltage received by the hybrid networks and communicated through the hybrid networks to the conducting segments.

12. The NMR radio frequency coil of claim 7 wherein the plurality of phased signals are connected to the plurality of conducting segments by impedance matching networks tuned to $\omega$.

* * * * *